United States Patent
Yamada

(10) Patent No.: US 6,827,636 B2
(45) Date of Patent: Dec. 7, 2004

(54) SEMICONDUCTOR DEVICE PRODUCTION METHOD AND APPARATUS

(75) Inventor: Yutaka Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/186,741

(22) Filed: Jul. 2, 2002

(65) Prior Publication Data

US 2002/0192927 A1 Dec. 19, 2002

Related U.S. Application Data

(62) Division of application No. 09/348,472, filed on Jul. 7, 1999.

(30) Foreign Application Priority Data

Jan. 19, 1999 (JP) ............................................. 11-010908

(51) Int. Cl.[7] ............................................... B24B 7/00
(52) U.S. Cl. .......................... 451/65; 451/69; 451/289; 83/861; 438/464
(58) Field of Search .......................... 83/861; 438/460, 438/462, 463, 464; 451/69, 285, 287, 289, 65

(56) References Cited

U.S. PATENT DOCUMENTS

| | | | | |
|---|---|---|---|---|
| 4,722,130 A | * | 2/1988 | Kimura et al. ................. | 29/413 |
| 5,238,876 A | * | 8/1993 | Takeuchi et al. ............. | 437/226 |
| 5,637,537 A | * | 6/1997 | Nath et al. .................... | 438/460 |
| 5,745,946 A | * | 5/1998 | Thrasher et al. ................ | 15/77 |
| 5,759,873 A | * | 6/1998 | Kata et al. .................... | 438/118 |
| 5,814,532 A | * | 9/1998 | Ichihara ........................ | 438/33 |
| 5,863,813 A | * | 1/1999 | Dando ........................... | 438/114 |
| 6,039,830 A | * | 3/2000 | Park et al. .................... | 156/267 |
| 6,162,703 A | * | 12/2000 | Muntifering et al. ........ | 438/465 |
| 6,271,102 B1 | * | 8/2001 | Brouillette et al. .......... | 438/462 |
| 6,286,499 B1 | * | 9/2001 | Yoshii et al. .................. | 125/12 |
| 6,297,075 B1 | * | 10/2001 | Odajima et al. ............. | 438/110 |
| 6,303,471 B1 | * | 10/2001 | Unno et al. ................... | 438/464 |
| 6,401,317 B1 | * | 6/2002 | Yamada ...................... | 29/33 M |
| 6,461,942 B2 | * | 10/2002 | Watanabe et al. ............ | 438/464 |
| 6,583,032 B1 | * | 6/2003 | Ishikawa et al. ............. | 438/462 |

* cited by examiner

Primary Examiner—Kenneth E. Peterson
Assistant Examiner—Omar Flores-Sánchez
(74) Attorney, Agent, or Firm—Armstrong, Kratz, Quintos, Hanson & Brooks, LLP

(57) ABSTRACT

A semiconductor device production method and a semiconductor device production apparatus are provided. The semiconductor device production method includes the steps of: sticking a wafer to a stretch tape stretchable by a physical process; dicing the wafer into individual semiconductor chips; stretching the stretch tape by performing the physical process on the stretch tape after the dicing: and grinding the rear surface of the wafer stuck to the stretch tape after the tape stretching.

5 Claims, 11 Drawing Sheets

( WEAK UV RAYS )

( STRONG UV RAYS )

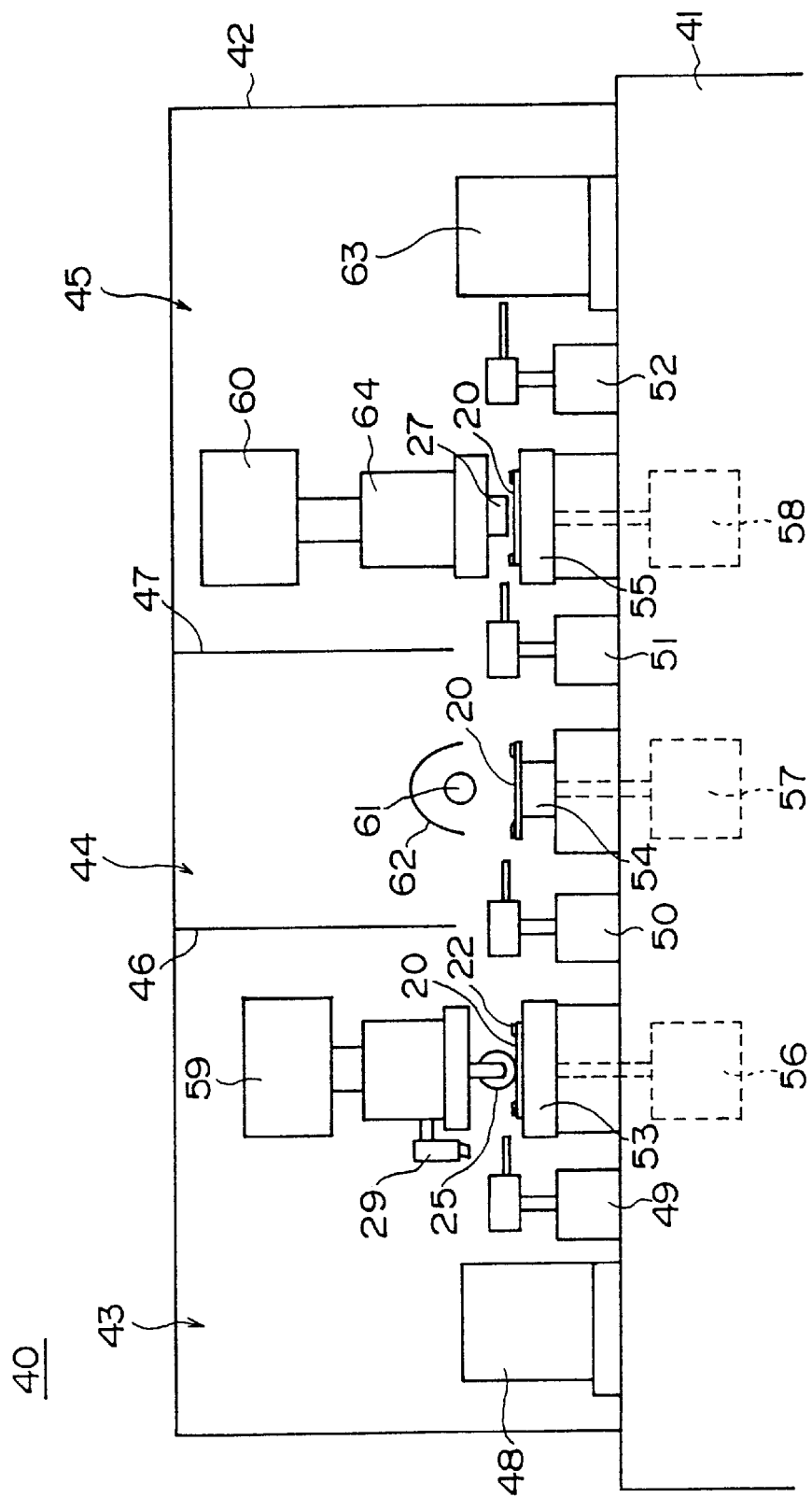

SEMICONDUCTOR DEVICE PRODUCTION METHOD AND APPARATUS

This is a division of application Ser. No. 09/348,472, filed Jul. 7, 1999.

BACKGROUND OF THE INVENTION

1. Field of the Invention

The present invention generally relates to a semiconductor device production method and a semiconductor device production apparatus, and more particularly, to a semiconductor device production method and a semiconductor device production apparatus in which grinding is performed on a wafer stuck to a tape.

In producing a semiconductor device, grinding is performed on the surface of the wafer so as to reduce the thickness of the wafer. However, a large load is applied to the wafer in the grinding step. For this reason, it has been desired that the grinding be performed at a high throughput without damaging the wafer.

2. Description of the Related Art

FIGS. 1 to 6 show a conventional semiconductor device production method and a conventional semiconductor production apparatus. It is widely known that a conventional semiconductor device production method includes a grinding step of grinding the rear surface of the wafer so as to thin the wafer to a desired thickness, and a dicing step of dicing the wafer into individual semiconductor chips.

Conventionally, there are two ways of performing the dicing step and the grinding step: as shown in FIG. 1A, the dicing step (step 10) is followed by the grinding step (step 11); or, as shown in FIG. 1B, the grinding step (step 20) is followed by the dicing step (step 21).

FIGS. 2 and 3 illustrate the dicing step (step 10) and the grinding step (step 11) of FIG. 1A.

A wafer 10 to be diced is fixed to a wafer frame 12 provided with a dicing tape 13. The dicing tape 13 is a resin tape coated with a ultraviolet curing adhesive, and the wafer 10 stuck to the dicing tape 13 is diced. The circuit forming surface (to which the dicing tape 13 is stuck) of the wafer 10 is covered with a protection tape 14 which protects the circuits in the wafer 10 at the time of dicing.

The wafer 10 is diced by a dicing saw 15, and is divided into individual semiconductor chips 11. At this point, groove-like gaps 16 each having a width corresponding to the blade width of the dicing saw 15 are formed between the semiconductor chips 11. The wafer 10 (i.e., the individual semiconductor chips 11) remains attached to the dicing tape 13 via the protection tape 14.

FIG. 3 illustrates the grinding step (step 11) carried out after the dicing step (step 10). In the grinding-step, a grinder 17 grinds the rear surface of the wafer 10 to thin the wafer 10 to a desired thickness. More specifically, the rotating grinder 17 supplied with an abrasive liquid is moved in the directions of arrows X1 and X2 shown in FIG. 3. Thus, the semiconductor chips 11 having the predetermined thickness can be formed.

FIG. 5 illustrates the grinding step (step 20) shown in FIG. 1B. In FIG. 5, the same components as in FIGS. 2 and 3 are indicated by the same reference numerals as well.

In the production method shown in FIG. 1B, the grinder 17 grinds the wafer 10 without the gaps 16, because the grinding step (step 20) is carried out prior to the dicing step (step 21). After the wafer 10 is thinned to the predetermined thickness by the grinding, the dicing step is carried out by the dicing saw 15 to form the semiconductor chips 11.

In the production method shown in FIG. 1A, the wafer 10 with the gaps 16 is ground, because the dicing step is carried out prior to the grinding step. The width W1 of each of the gaps 16 is substantially equal to the blade width of the dicing saw 15. More specifically, the width W1 is as small as about 20 $\mu$m, for instance.

The wafer 10 is diced into the individual semiconductor chips 11, and the bottom of each of the semiconductor chips 11 is stuck to the dicing tape 13 via the protection tape 14. Because of this, the fixing force for each of the semiconductor chips 11 is small, often resulting in displacement. Also, since the grinder 17 moves in the directions of the arrows X1 and X2 while rotating, a large external force is applied to each of the semiconductor chips 11.

For the above reasons, the semiconductor chips 11 are displaced at the time of grinding, and collisions occur between the semiconductor chips 11. FIG. 4 shows the problem caused when the grinder 17 is moving in the direction of the arrow X1. The semiconductor chip 11 on the right side in the figure is subjected to the force (external force) in the X1 direction along with the movement of the grinder 17.

The semiconductor chip 11 subjected to the external force is displaced in the direction of an arrow A in the figure, and the upper corner of the semiconductor chip 11 collides with the adjacent semiconductor chip 11. The displaced position of the semiconductor chip 11 on the right side is indicated by a broken line. Because of the collision, a crack 18 might occur in the upper corner of the semiconductor chip 11, resulting in a poor production yield and a low throughput.

On the other hand, in the production method shown in FIG. 1B, the grinder 17 grinds the wafer 10 without the gaps 16 (as shown in FIG. 5), because the grinding step is carried out prior to the dicing step. Thus, the crack 18 shown in FIG. 4 can be prevented.

By the method of FIG. 1B, however, a warp is caused in the wafer 10 as shown in FIG. 10, when the wafer 10 is ground to the predetermined thickness. Such a warp can be measured by the maximum distance (indicated by an arrow H in the figure) between the dicing tape 13 (or the protection tape 14) and the wafer 10. If a 6-inch wafer is ground to a thickness of 200 $\mu$m, a warp of about 2 cm is caused (H=2 cm). If an 8-inch wafer is ground to a thickness of 200 $\mu$m, a warp of about 3 cm is caused (H=3 cm).

With such a warp in the wafer 10, it is difficult to handle the wafer 10 without damaging it. The possibility of the 8-inch wafer being broken is about 50%, resulting in a poor production yield and a lower throughput.

SUMMARY OF THE INVENTION

A general object of the present invention is to provide a semiconductor device production method and a semiconductor device production apparatus in which the above disadvantages are eliminated.

A more specific object of the present invention is to provide a semiconductor device production method and a semiconductor device production apparatus having a large yield and a high throughput.

The above objects of the present invention are achieved by a semiconductor device production method which includes the steps of: sticking a wafer to a tape stretchable by a physical process; dicing the wafer into individual semiconductor chips; stretching the tape by carrying out the physical process after the dicing; and grinding the rear surface of the wafer stuck to the tape after the tape stretching.

The above objects of the present invention are also achieved by another semiconductor device production method which includes the steps of: dicing a wafer whose rear surface is stuck to a dicing tape, the rear surface is opposite to the circuit forming surface of the wafer; sticking a tape onto the circuit forming surface of the wafer after the dicing, and removing the dicing tape from the rear surface of the wafer; stretching the tape by performing the physical process on the tape; and grinding the rear surface of the wafer stuck to the tape after the step of tape stretching.

The above objects of the present invention are also achieved by a semiconductor device production apparatus including: a dicing unit which dices a wafer stuck to a tape stretchable by a physical process; a physical process unit which stretches the tape by performing the physical process on the tape by physical process means; and a grinding unit which grinds a rear surface of the wafer by a grinder, with the tape being stuck to the wafer.

In the semiconductor device production method and apparatus of the present invention, the tape is stretched so that the gaps between the semiconductor chips become wider. With the wider gaps, even if displacement occurs in the semiconductor chips, the semiconductor chips do not collide with each other, and no crack is caused in the semiconductor chips. Thus, semiconductor devices can be produced at a high rate of yield and a high throughput.

The above and other objects and features of the present invention will become more apparent from the following description taken in conjunction with the accompanying drawings.

BRIEF DESCRIPTION OF THE DRAWINGS

FIG. 17 illustrates a semiconductor device production apparatus of one embodiment of the present invention.

DESCRIPTION OF THE PREFERRED EMBODIMENTS

The following is a description of the embodiments of the present invention, with reference to the accompanying drawings.

Figure 7:
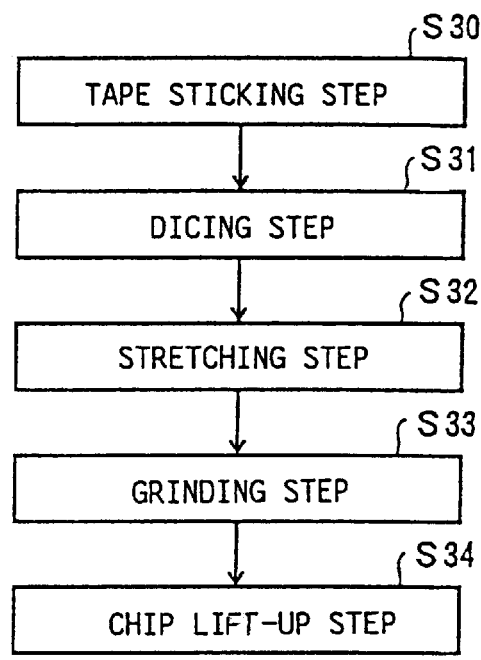
FIG. 7 is a flowchart of a method of producing a semiconductor device of one embodiment of the present invention.

FIG. 7 is a flowchart showing a method of producing a semiconductor device of an embodiment of the present invention. This method of producing a semiconductor device of the present invention is characterized by a step of dicing a wafer and a step of grinding the wafer. The rest of the method is the same as the prior art.

As shown in FIG. 7, the method of producing a semiconductor device of the present invention comprises a tape sticking step (step 30), a dicing step (step 31), a tape stretching step (step 32), a grinding step (step 33), and a chip lift-up step (step 34).

Figure 8:
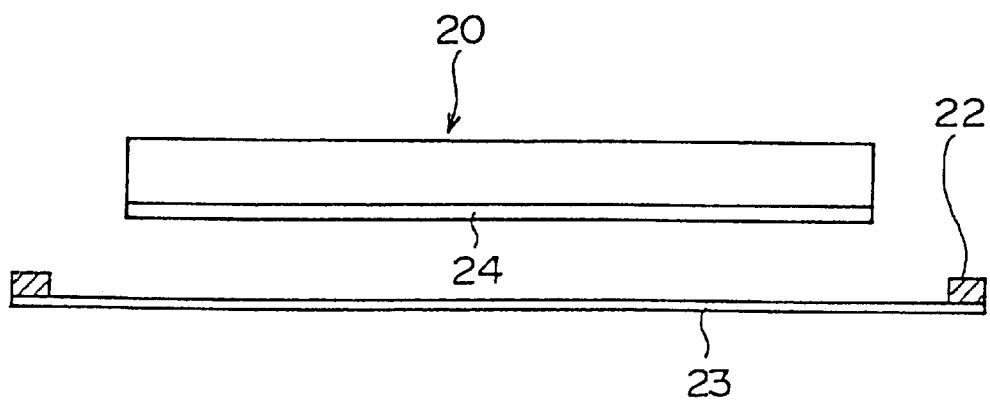
FIG. 8 illustrates the tape sticking step shown in FIG. 7.

FIG. 8 illustrates the tape sticking step (step 30). As shown in the figure, a protection tape 24 is attached to the circuit forming surface (the bottom surface) of a wafer 20. The protection tape 24 is made of polyimide, for instance. The material for the wafer 20 is not specifically limited, but any semiconductor substrate made of silicon or gallium arsenide may be employed for the wafer 20. A substrate made of ferrite may also be employed.

The wafer 20 provided with the protection tape 24 is placed on a stretch tape 23 attached to a wafer frame 22. More specifically, a ultraviolet curing adhesive (not shown) is applied to the stretch tape 23, so that the wafer 20 is stuck to the stretch tape 23.

In this embodiment, the stretch tape 23 is a resin tape which can be stretched by weak ultraviolet rays. For instance, UC-353EP-110 (manufactured by FURUKAWA ELECTRIC CO., LTD.) can be used for stretching the stretch tape 23.

If a material having a high thermal expansion coefficient is employed, the stretch tape 23 may also be stretched by heat. If a material stretchable by X-rays is employed, the stretch tape 23 is stretched by X-rays. If a material having plastic deformation properties is employed, the stretch tape 23 is stretched by a mechanical force. The stretch tape 23 can also be stretched by infrared rays, electron beams, or laser, whichever is suitable for the type of material employed.

The tape sticking step (step 30) is followed by the dicing step (step 31), the tape stretching step (step 32), and the grinding step (step 33), in that order. FIG. 17 shows a semiconductor device production apparatus 40 which carries out the dicing step, the tape stretching step, and the grinding step.

The semiconductor device production apparatus 40 has a cover 42 on a base 41. Inside the cover 42, there are a dicing unit 43, a UV irradiation unit 44, and a grinding unit 45. The three units are separated by walls 46 and 47. The dicing unit 43 carries out the dicing step, the UV irradiation unit 44 carries out the tape stretching step, and the grinding unit 45 carries out the grinding step.

The dicing unit 43 includes a dicing saw 25, an infrared camera 29, a supply cassette 48, a first transportation device 49, a first chuck plate 53, a first suction device 56, and a first drive 59. The supply cassette 42 contains a plurality of wafers 20 each stuck to the stretch tape 23 attached to the wafer frame 22. Before carrying out the back grinding process, the wafer 20 is 750 $\mu$m in thickness. The first transportation device 49 takes out the wafer 20 from the supply cassette 48, and transports it onto the first chuck plate 53. The first chuck plate 53 is of a porous type, for instance. The first chuck plate 53 is connected to the first suction device 56, so that the wafer 20 is vacuum-chucked. After the wafer 20 is mounted on the first chuck plate 53, the first suction device 56 starts a suction operation to fix the wafer 20 to the first chuck plate 53.

The dicing saw 25 is disposed above the first chuck plate 53. The blade of the dicing saw 25 is, for instance, 20 μm in thickness, and is rotated by the first drive 59 for a predetermined number of revolutions. The first drive 59 moves the dicing saw 25 three-dimensionally (i.e., in the vertical and horizontal directions) with respect to the wafer 20, so that the dicing saw 25 dices the wafer 20 in a predetermined dicing position.

The infrared camera 29 is situated above the dicing saw 25, and picks up an image of the wafer 20. An infrared ray lamp (not shown) is disposed near the infrared camera 29, and emits infrared rays onto the wafer 20. The infrared camera 29 picks up an image in accordance with the reflected infrared rays from the wafer 20.

The UV irradiation unit 44 includes a second transportation device 50, a second chuck plate 54, a second suction device 57, and a ultraviolet ray lamp 61 (hereinafter referred to as the "UV lamp").

The second transportation device 50 takes out the wafer 20 diced in the dicing unit 43 from the first chuck plate 53, and transports it onto the second chuck plate 54. Here, the second transportation device 50 vertically reverses the wafer 20, and then places the safer 20 onto the second chuck plate 54.

The second chuck plate 54 may also be of a porous type, and is connected to the second suction device 57 so as to suck the wafer 20 and the stretch tape 23. Here, the second chuck plate 54 is larger than the stretch tape 23, so that the second chuck plate 54 sucks the entire surface of the stretch tape 23.

The UV lamp 61 is disposed above the second chuck plate 54. With the wafer 20 being placed on the second chuck plate 54, the UV lamp 61 faces the stretch tape 23.

When the wafer 20 is placed on the chuck plate 54, the second suction device 57 starts its suction operation, and the UV lamp 61 starts emitting ultraviolet rays (UV rays). The suction force by the suction operation and the UV rays stretch the stretch tape 23. A reflector 62 is disposed above the UV lamp 61 so as to emit UV rays onto the stretch tape 23 uniformly and efficiently.

The grinding unit 45 includes a grinder 27, a third chuck plate 55, a third suction device 58, a third transportation device 51, a fourth transportation device 52, a second drive 60, and a storage cassette 63.

The third transportation device 51 takes out the wafer 20 from the second chuck plate 54 after the stretch tape 23 is stretched in the UV irradiation unit 44. The third transportation device 51 then transports the wafer 20 onto the third chuck plate 55. Here, the third transportation device 51 vertically reverses the wafer 20, and then places the wafer 20 onto the third chuck plate 55.

The third chuck plate 55 may also be of a porous type, and is connected to the third suction device 58 so as to suck the wafer 20 and the stretch tape 23. Here, the third chuck plate 55 is larger than the stretch tape 23, so that the third chuck plate 55 sucks the entire surface of the stretch tape 23.

When the wafer 20 is placed on the third chuck plate 55, the third suction device 58 starts its suction operation. The suction force stretches the stretch tape 23.

The grinder 27 (a grindstone) is disposed above the third chuck plate 55. The grinder 27 is a diamond wheel, for instance, and is attached to a wheel 64 connected to the second drive 60. In this embodiment, the grinder 27 rotates to perform a grinding process on the rear surface of the wafer 20. The second drive 60 contains a motor for rotating the grinder 27 and a moving device for moving the grinder both in the vertical and horizontal directions.

The fourth transportation device 52 takes out the ground wafer 20 from the third chuck plate 55, and puts it in the storage cassette 63 together with the wafer frame 22 and the stretch tape 23.

Figure 9:
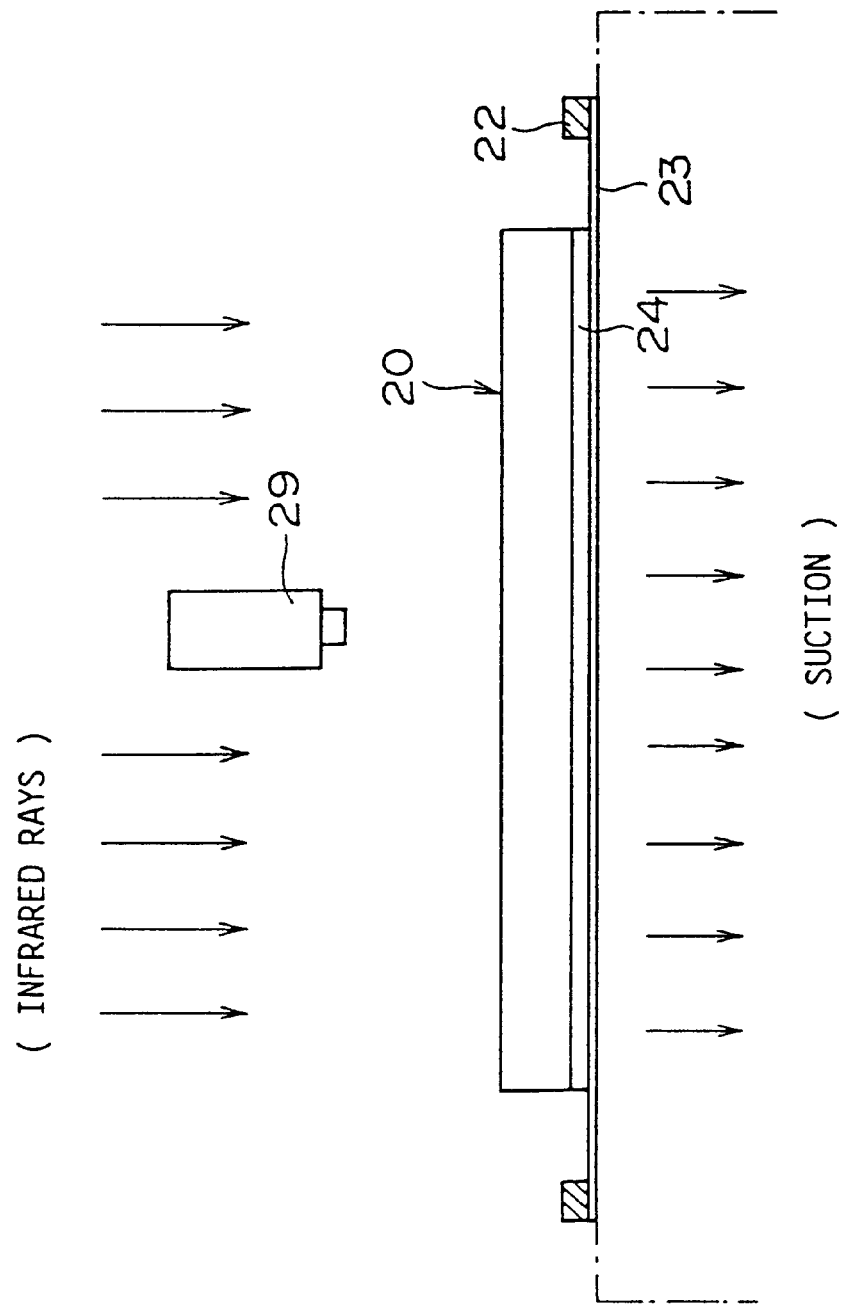
FIG. 9 illustrates the dicing step shown in FIG. 7.
Figure 10:
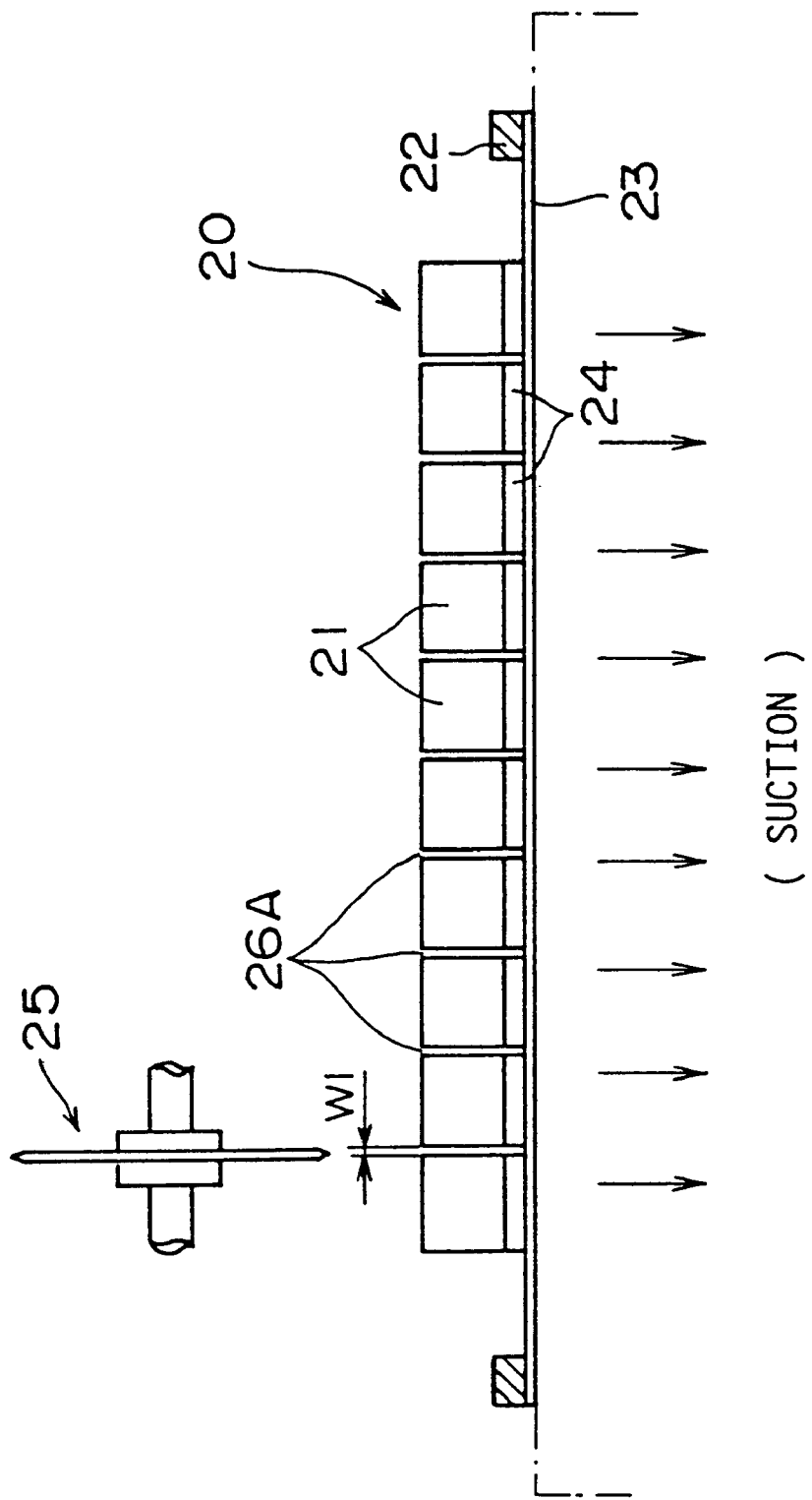
FIG. 10 illustrates the dicing step shown in FIG. 7.

FIGS. 9 and 10 illustrate the dicing step to be carried out by the semiconductor device production apparatus 40.

In the dicing step, the dicing position of the wafer 20 is confirmed by the infrared camera 29 disposed in the dicing unit 43. When carrying out the dicing step, a dicing line (made of an aluminum layer, for instance) is formed at the same time as the formation of a circuit pattern on the circuit formation side surface of the wafer 20, and the dicing is performed based on the dicing line.

Since the surface opposite to the circuit formation side surface is ground in the grinding step, the circuit formation side surface of the wafer 20 needs to be stuck to the stretch tape 23. To directly recognize the dicing line, it is necessary to change the directions of the wafer 20 with respect to the stretch tape 23 in the dicing step and the grinding step, thereby complicating the production procedures.

On the other hand, the dicing line can be recognized from the rear surface of the wafer 20 by using infrared rays in this embodiment. When infrared rays are emitted onto the wafer 20, the aluminum layer formed as the dicing line reflects the infrared rays. The infrared camera 29 then picks up an image of the reflected infrared rays, so that the dicing line can be recognized from the rear surface of the wafer 20. In this manner, it becomes unnecessary to reverse the direction of the wafer 20 in the dicing step and the grinding step, and the production procedures can be simplified.

After the dicing position is recognized, the first drive 59 rotates the dicing saw 25 and moves the dicing saw 25 along the dicing position. By doing so, the wafer 20 is diced into individual semiconductor chips 21, as shown in FIG. 10.

Figure 1A:
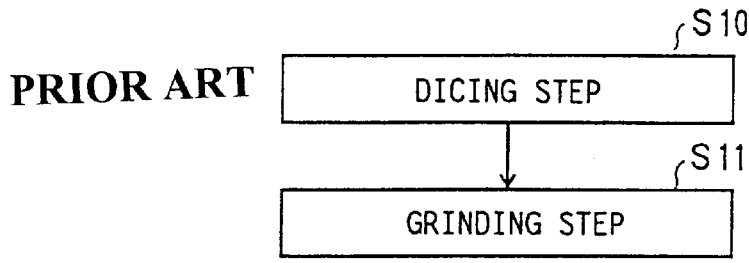
FIGS. 1A and 1B are flowcharts of a method of producing a conventional semiconductor device.
Figure 1B:
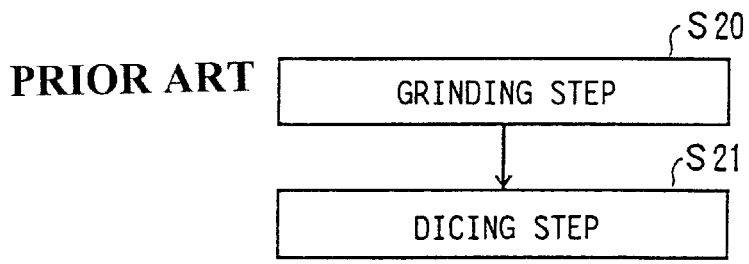
Figure 2:
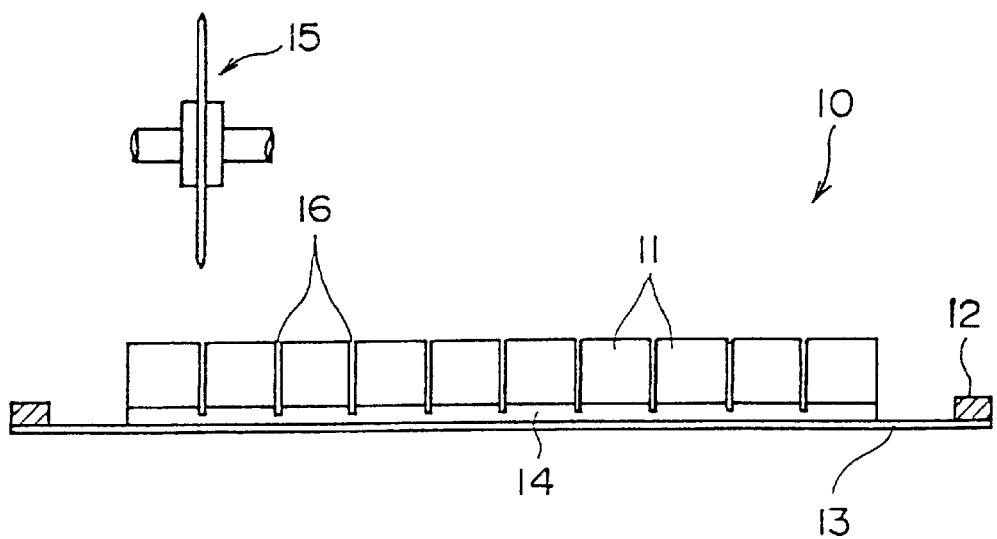
FIG. 2 illustrates the dicing step shown in FIG. 1A.
Figure 3:
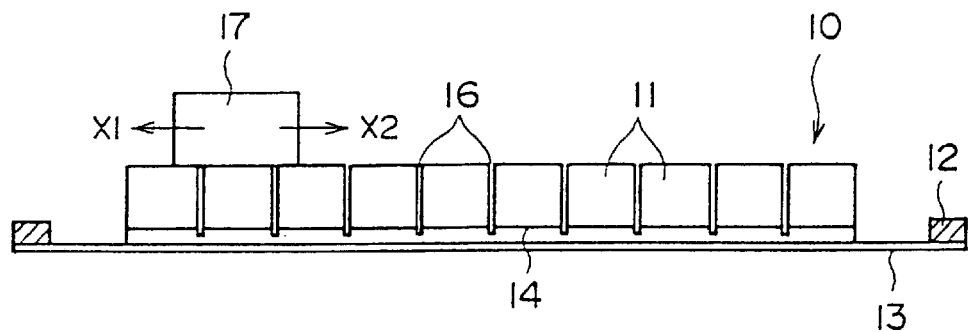
FIG. 3 illustrates the grinding step shown in FIG. 1A.
Figure 4:
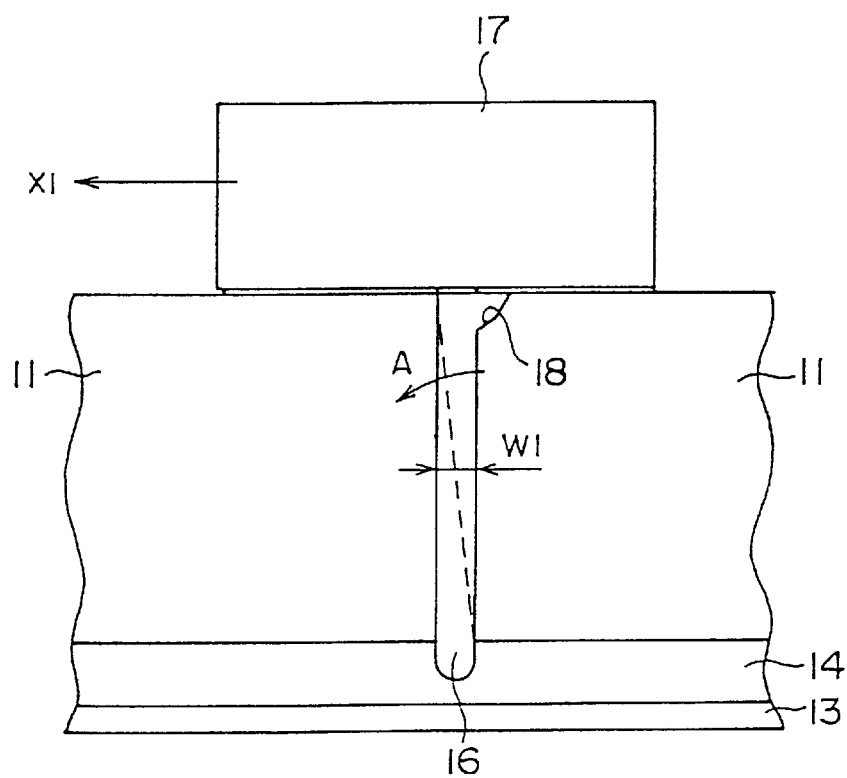
FIG. 4 shows a problem with the method of producing the conventional semiconductor device.
Figure 5:
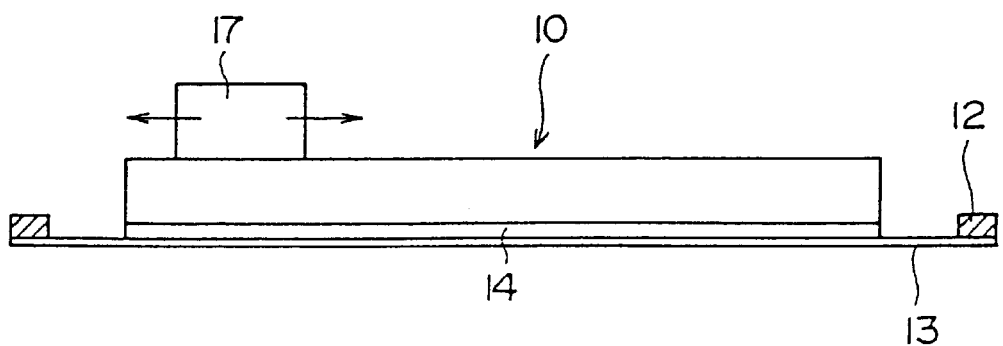
FIG. 5 illustrates the grinding step shown in FIG. 1B.
Figure 6:
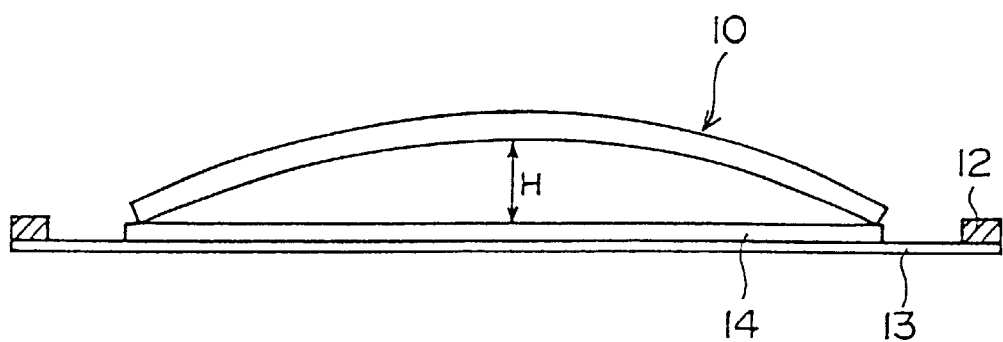
FIG. 6 shows another problem with the method of producing the conventional semiconductor device.

As the blade of the dicing saw 25 is 20 μm as mentioned before, gaps 26A each having a width W1(about 20 μm) corresponding to the blade width of the dicing saw 25 are formed between the semiconductor chips 21. If the grinding step is carried out on the semiconductor chips 21 with such narrow gaps 26A, collisions occur between the neighboring semiconductor chips 21, resulting in cracks as shown in FIG. 4.

Figure 11:
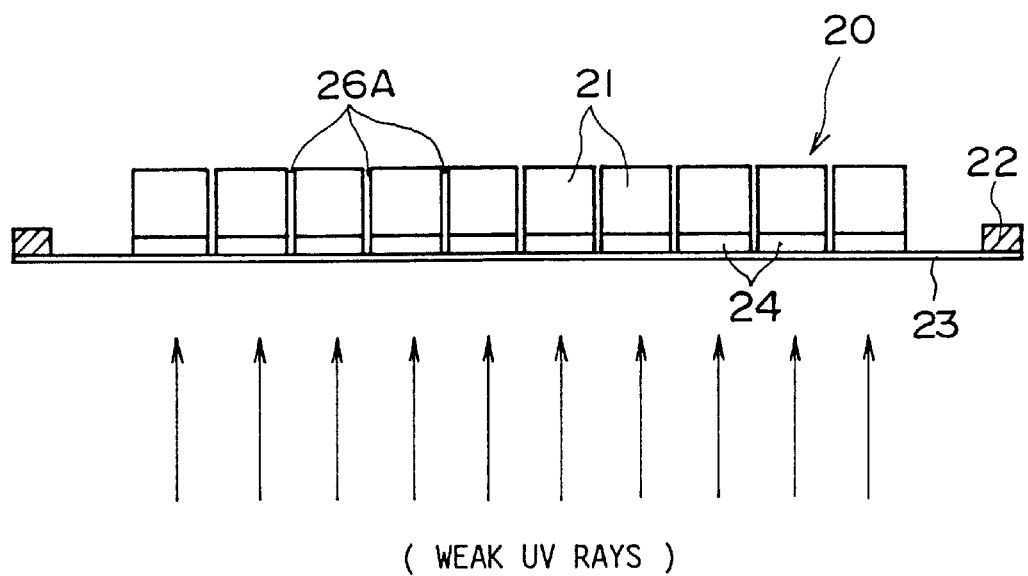
FIG. 11 illustrates the tape stretching step shown in FIG. 7.
Figure 12:
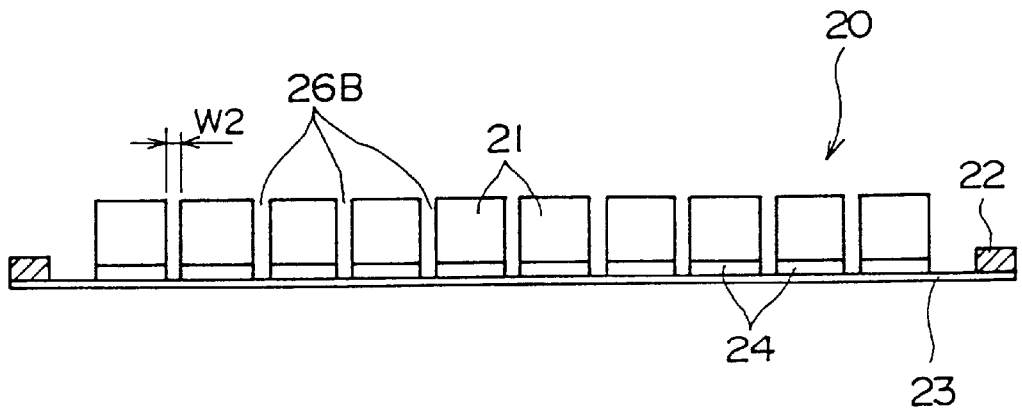
FIG. 12 illustrates the tape stretching step shown in FIG. 7.

The dicing step (step 31) is followed by the tape stretching step (step 32). FIGS. 11 and 12 illustrate the tape stretching step.

The diced wafer 20 is transported to the UV irradiation unit 44 (shown in FIG. 17), and the UV lamp 61 emits UV rays onto the stretch tape 23, as shown in FIG. 11. The stretch tape 23 is stretched by the UV rays. As the stretch tape 23 is stretched, the gaps W2 between the semiconductor chips 21 become wider (W2>W1), as shown in FIG. 12.

The second chuck plate 54 is larger than the stretch tape 23, so that the entire surface of the stretch tape 23 can be sucked. The suction force of the second suction device 57 further stretches the stretch tape 23, which has been already stretched by UV rays. Thus, the gaps W2 between the semiconductor chips 21 can be widened.

Although the stretch tape 23 is further stretched by the suction force of the second suction device 57 in this embodiment, it is possible to employ a structure that forcibly stretches the stretch tape 23 by a pressing device.

The stretch tape 23 may be made of a material which can be stretched by something other than UV rays in the tape stretching step. If the stretch tape 23 is made of a material having a high thermal expansion coefficient, heat is applied to the stretch tape 23 in the tape stretching step. If the stretch tape 23 is made of a material which can be stretched by X-ray irradiation, X rays are emitted onto the stretch tape 23 in the tape stretching step.

Although a ultraviolet curing adhesive is used when sticking the wafer 20 to the stretch tape 23 in this embodiment, the stretch tape 23 is stretched by weak UV rays (200 mj/cm$^2$ or weaker, for instance) instead of strong UV rays (200 mj/cm$^2$ or stronger) that cures the ultraviolet curing adhesive. In this manner, the wafer 20 is never removed from the stretch tape 23 in the tape stretching step even if UV rays are emitted onto the stretch tape 23.

Figure 13:
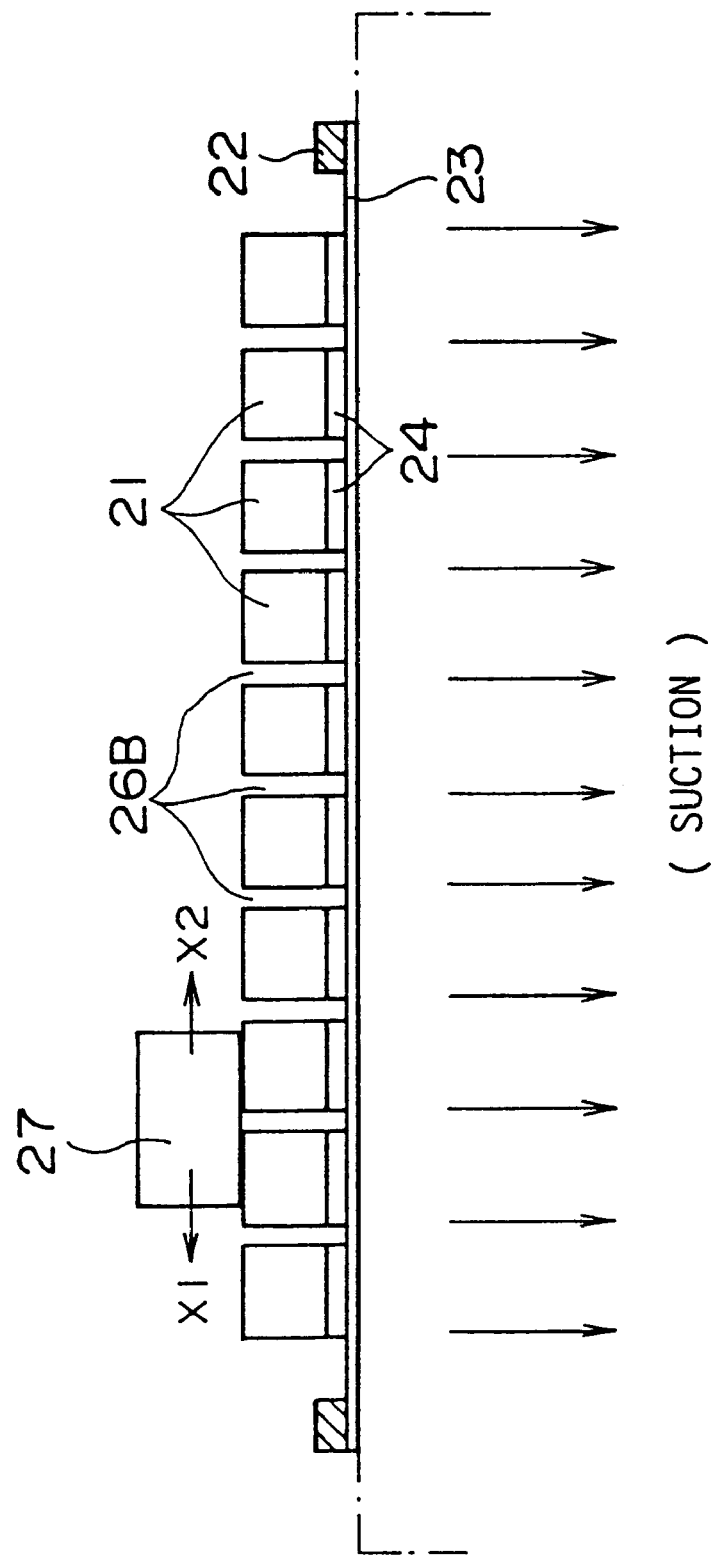
FIG. 13 illustrates the grinding step shown in FIG. 7.
Figure 14:
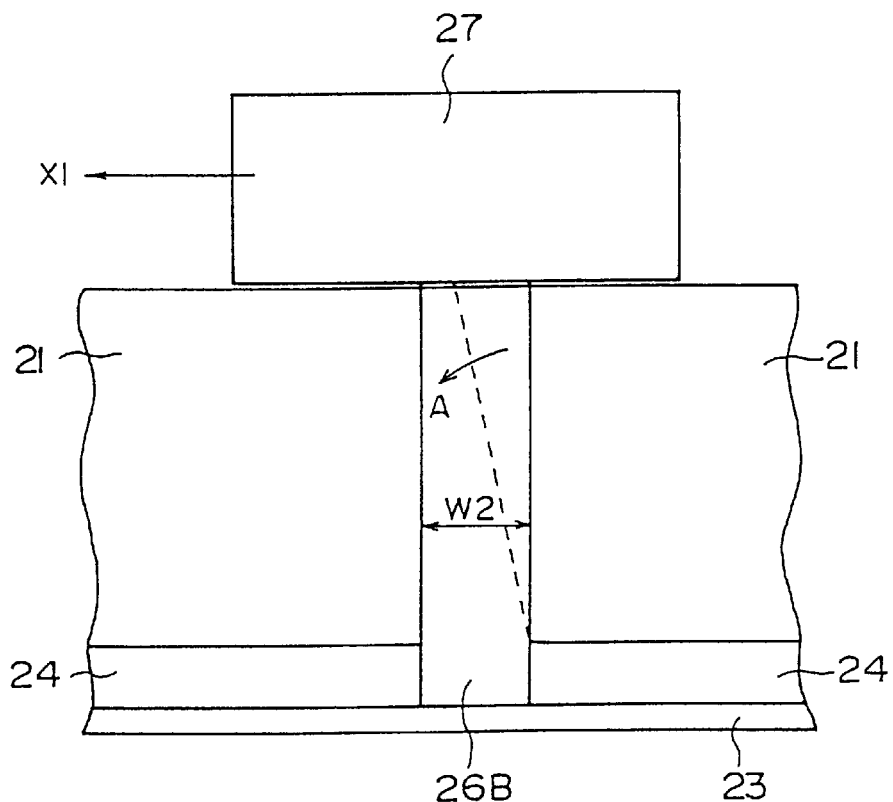
FIG. 14 illustrates the grinding step shown in FIG. 7.

The tape stretching step (step 32) is followed by the grinding step. FIGS. 13 and 14 illustrate the grinding step.

FIG. 13 shows the grinder 27 grinding the rear surface of the wafer 20 (i.e., the semiconductor chips 21) stuck to the stretched stretch tape 23. Since the dicing step is performed prior to the grinding step in this embodiment, the grinding step is carried out on the wafer 20 with gaps 26B. Even if the wafer 20 is thinned by the grinding, no warp is caused in the wafer 20.

As a large external force is applied to the semiconductor chips 21 in the grinding step, the semiconductor chips 21 are displaced. However, the gaps W21 between the semiconductor chips 21 are widened by stretching the stretch tape 23 in the tape stretching step in this embodiment. Here, each of the semiconductor chips formed in the dicing step is 3 mm in both height and width (hereinafter indicated as □3 mm), and each gap W2 between the semiconductor chips 21 is 50 μm in width.

As shown in FIG. 14, even if the semiconductor chips 21 are displaced in the direction of an arrow A (a shifted semiconductor chip 21 is shown by a broken line in the figure) along with the movement of the grinder 27 in the direction of an arrow X1, the neighboring semiconductor chips 21 do not collide with each other, and no crack is caused in the semiconductor chips 21. Thus, high-yield and high-throughput production of semiconductor devices can be achieved.

The inventor has produced various semiconductor chips 21 by dicing, and determined the relationship between the blade width (equal to the width W2 of the gaps 26B), the gaps between the chips after stretching (equal to the widths W2), and the number of defective chips after grinding. The results are shown in Table 1.

TABLE 1

| size of chips | blade width | chip gaps after the stretching step | Number of defective chips after the grinding step |
| --- | --- | --- | --- |
| □1 mm | 20 μm | 30 μm | 0/10000 |
| □2 mm | 20 μm | 30 μm | 0/4000 |
| □3 mm | 20 μm | 50 μm | 0/3000 |
| □5 mm | 60 μm | 90 μm | 0/500 |
| □7 mm | 60 μm | 90 μm | 0/500 |
| □10 mm | 60 μm | 120 μm | 0/500 |

As can be seen from Table 1, chips smaller than □3 mm are normally ground by a dicing saw 25 having a blade width of 20 μm. If a stretch tape 23 which can have chip gaps of 30 μm to 50 μm after stretching is used, the semiconductor chips 21 after grinding are free of defects. In Table 1, "0/10000" indicates that the number of defective chips was "0" after 10,000 semiconductor chips have been ground.

To grind chips larger than □5 mm, a dicing saw 25 having a blade width of 60 μm is used. If a stretch tape 23 which can have chip gaps of 90 μm to 120 μm after stretching is used, the semiconductor chips 21 are free of defects after grinding.

According to the tests conducted by the inventor, it has become apparent that fewer defective chips are produced when the gaps 26B between the adjacent semiconductor chips 21 is 24 μm or greater, regardless of the size of the semiconductor chips 21. The number of defective chips can also be reduced when the stretch tape 23 having an elongation percentage (the rate of the length L1 before stretching to the length L2 after stretching) of 1.2 or higher.

Figure 15:
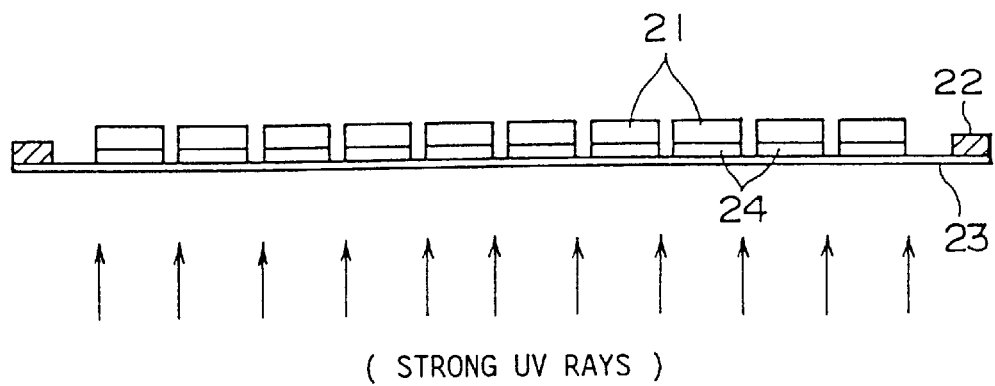
FIG. 15 illustrates the chip lift-up step shown in FIG. 7.
Figure 16:
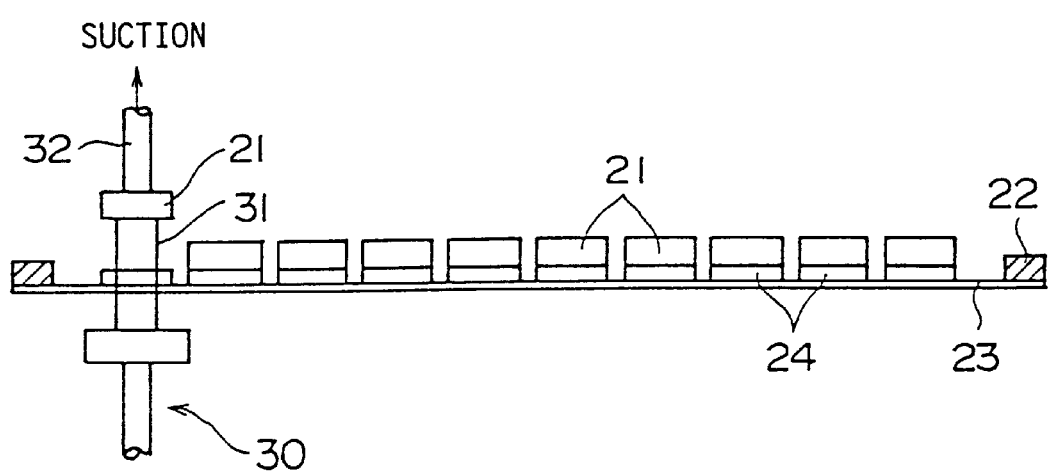
FIG. 16 illustrates the chip lift-up step shown in FIG. 7.

The grinding step (step 33) is followed by the chip lift-up step (step 34). FIGS. 15 and 16 illustrate the chip lift-up step.

As shown in FIG. 15, UV rays are emitted onto the rear surface of the stretch tape 23 in the chip lift-up step. The UV rays are strong (200 mj/cm$^2$ or stronger, for instance) enough to cure the ultraviolet curing adhesive that attaches the wafer 20 (semiconductor chips 21) to the stretch tape 23. The UV rays cure the ultraviolet curing adhesive to reduce the bond between the stretch tape 23 and the wafer 20 (or the semiconductor chips 21).

As shown in FIG. 16, a lift-up device 30 lifts up the semiconductor chips 21. The lift-up device 30 has a plurality of pins 31 (probes). The pins 31 are stuck from the rear surface of the stretch tape 23 to remove semiconductor chips 21 from the stretch tape 23 and the protection tape 24. The removed semiconductor chips 21 are sucked by a collet 32, and then transported into a chip storage cassette.

In the above embodiment, the protection tape 24 attached to the circuit forming surface of the wafer 20 is stuck to the stretch tape 23 in the tape sticking step (step 30) shown in FIG. 8. However, it is also possible to dice the wafer 20 whose rear surface is stuck to a dicing tape conventionally used for dicing, stick the stretch tape 23 to the circuit forming surface of the wafer 20, and then remove the dicing tape. Such dicing step and sticking step are followed by the tape stretching step and the grinding step. In this manner, semiconductor chips can also be produced at a high rate of yield and a high throughput.

Although the stretch tape 23 and the protection tape 24 are separate components in the above embodiment, it is possible to integrate the function of the protection tape 24 into the stretch tape 23. The stretch tape 23 having such a structure can further simplify the production procedures, and reduce the number of components.

The gaps 26B between the semiconductor chips 21 can be widened by using the dicing saw 25 having a great blade width. However, the dicing saw 25 having a great blade width increases the sawn area on the surface of the wafer 20. As a result, the chip region becomes smaller, and the number of semiconductor chips obtained from the wafer 20 is reduced. Accordingly, the entire production efficiency is reduced.

By widening the gaps 26B between the semiconductor chips 21 by stretching the stretch tape 23, defects in chips can be prevented at the time of grinding with the dicing saw 25 having a small blade width. By this method, the number of semiconductor chips obtained from one wafer can be increased, fewer defective chips are produced, and the production efficiency can be dramatically improved.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The present application is based on Japanese priority application No. 11-10908, filed on Jan. 19, 1999, the entire contents of which are hereby incorporated by reference.

What is claimed is:

1. A semiconductor device production apparatus comprising:
    a base;
    a cover on the base forming an enclosure;
    a dicing unit which dices a wafer stuck to a tape stretchable by a physical process;
    a physical process unit which stretches the tape by performing the physical process on the tape by physical process means;
    a grinding unit which grinds a rear surface of the wafer by a grinder, with the tape stuck to the wafer;
    the dicing unit, physical process unit and grinding unit located in the enclosed with the physical process unit located between the dicing unit and the grinding unit; and
    an infrared camera disposed on the dicing unit to pick up an image in accordance with reflected infrared rays from the wafer when infrared rays are emitted to the wafer, so that a dicing line formed on the wafer can be recognized from the rear surface of the wafer without reversing a direction of the wafer during the dicing and grinding of the wafer.

2. The semiconductor device production apparatus according to claim 1, wherein the grinding unit has a chuck plate for sucking and fixing the wfer, the chuck plate being larger than the wafer.

3. The semiconductor device production apparatus according to claim 1, wherein the physical process unit is a UV irradiation unit.

4. The semiconductor device production apparatus according to claim 1, wherein the dicing unit and physical process unit are separated by a wall.

5. The semiconductor device production apparatus according to claim 4, wherein the physical process unit and grinding unit are separated by a wall.

* * * * *